United States Patent [19]

Olsen et al.

[11] 4,096,626
[45] Jun. 27, 1978

[54] METHOD OF MAKING MULTI-LAYER PHOTOSENSITIVE GLASS CERAMIC CHARGE PLATE

[75] Inventors: Carlton Edward Olsen, San Jose; Leroy Jasper Serpa, Campbell, both of Calif.

[73] Assignee: International Business Machines Corporation, Armonk, N.Y.

[21] Appl. No.: 754,708

[22] Filed: Dec. 27, 1976

[51] Int. Cl.² .................. H05K 3/10; G01D 15/18
[52] U.S. Cl. ........................ 29/624; 156/629; 156/663; 346/75
[58] Field of Search .............. 29/624, 625; 346/75; 156/629, 633, 663, 901, 902; 427/96, 97; 361/414, 412; 174/68.5

[56] References Cited

U.S. PATENT DOCUMENTS

| | | | |
|---|---|---|---|
| 3,492,523 | 1/1970 | Smith et al. | 156/629 X |
| 3,509,268 | 4/1970 | Schwartz et al. | 361/414 X |
| 3,586,907 | 6/1971 | Beam | 346/75 X |
| 3,714,706 | 2/1973 | Reizman et al. | 29/624 |
| 3,825,456 | 7/1974 | Weber et al. | 156/663 X |
| 3,975,741 | 8/1976 | Solyst | 346/75 |
| 3,999,004 | 12/1976 | Chirino | 29/625 X |

*Primary Examiner*—Victor A. DiPalma
*Attorney, Agent, or Firm*—Otto Schmid, Jr.

[57] ABSTRACT

A method for fabricating a multi-layer laminated charge plate for an ink jet printer. The charge plate is produced by selectively etched layers of photosensitive glass. By exposure of the photosensitive glass and controlled etching, the intermediate layers are provided with slots partially or completely etched through the thickness of the layers for the conductors to connect a charge electrode hole with pin connector pads. A heat treating process is used to bond the various layers of different thickness and configuration together by self-diffusion bonding. Metallization of the conductor paths is carried out with suitable alloys. The alloys with melting points higher than the bonding temperature can be deposited on appropriate layers prior to laminating. An alternate approach is to laminate the charge plate and produce metallization of the conductor path with a low melting point conductor by capillary flow.

8 Claims, 8 Drawing Figures

METHOD OF MAKING MULTI-LAYER PHOTOSENSITIVE GLASS CERAMIC CHARGE PLATE

CROSS REFERENCE TO RELATED APPLICATION

"Process for Producing Precision Parts from Photosensitive Material" by C. E. Olsen and L. J. Serpa, application Ser. No. 754,463, filed Dec. 27, 1976.

BACKGROUND OF THE INVENTION

Electrostatic pressure ink jet systems are generally of one of two types. An example of one type is represented by Sweet U.S. Pat. No. 3,596,275 wherein pressurized electrically conductive fluid is ejected from a single nozzle as a fluid filament and perturbated for breaking into a stream of uniform drops. As each drop breaks off from its fluid filament, it may be selectively and variably charged by a charge field from a charge electrode. The drops then pass through an electrostatic deflection field and are deflected from the normal path a distance which is related to the magnitude of the charges carried by the droplets. The droplets may then impact a recording medium at a location determined by the deflection distance. The other type of system is represented by Sweet et al U.S. Pat. No. 3,373,437 wherein the pressurized electrically conductive fluid is ejected from a plurality of orifices and broken into plural streams of uniform drops. Again, as each drop breaks off from its fluid filament, it may be selectively charged by an associated charge electrode. Rather than variably charging the drops, this type of system operates binarily, giving a drop either a predetermined charge or leaving it in an uncharged condition. The drops then pass through an electrostatic deflection field, the charged drops being deflected thereby to a drop catcher or gutter, while the uncharged drops are undeflected and continue past the deflection field to impact a recording medium for printing.

The charge electrodes previously used comprise an electrically conductive material partially or wholly surrounding the corresponding ink jet stream and extending uniformly along the stream a distance of several drops. The reason for this is that the drop is charged in accordance with the field established by the charge electrode at the instant the drop breaks off from the filament, but the precise breakoff point can vary axially along the stream depending upon such factors as fluid viscosity and pressure. The field must be uniform along this axial distance so that the drops are properly charged without regard to the precise point of breakoff. For example, the charge electrode shown in Sweet U.S. Pat. No. 3,596,275 comprises an elongate ring or tube. In Sweet et al U.S. Pat. No. 3,373,437, the charge electrode comprises a U-shaped channel.

Insertion of the ring or the channel electrodes into a supporting structure and then connecting the charge electrodes to a charging signal source is difficult and costly, especially in the multi-jet binary ink jet systems such as the Sweet et al patent above.

The ink jet charge plate presents a combination of materials compatibility and fabrication problems. The required functional features include a large (60–240)array of small (7–10 mil diameter) holes with close tolerances on both diameter and location in a 30–50 mil thick dielectric substrate. A separate, through-hole, conductor path is needed from each hole to a pin connector pad or other external circuit. All conductor lines must be insulated from the conductive ink which passes through the holes. Although the ink will not touch the charge plate during steady state operation, it is necessary for external surfaces, which are likely to become wet with ink occasionally, to resist chemical interaction and partial charging with neighboring electrodes.

Process efforts in charge plates with slots or etched holes have made use of plating or vapor deposition techniques to deposit metallization on the external surface of the dielectric. This produces a change in the hole diameter that must be controlled, and may lead to uneven thickness depending on the method of deposition. Pinhole free, thin film passivation is difficult with surface circuitry because the total surface must be covered, including metallization surface contours, insides of holes and the surface roughness from both substrate and metallization.

SUMMARY OF THE INVENTION

The method for forming a multi-layer laminated charge plate in photosensitive glass comprising the steps of exposing a plurality of layers of photosensitive material to a source of radiation through a mask, etching the layers of photosensitive material in the exposed areas to produce a pattern of the openings and conductor path slots, positioning the layers in stacked configuration with the openings in co-axial alignment, bonding the layers together by heat treating the stacked layers at a temperature sufficient to produce self-diffusion bonding and metallizing the conductor paths to produce a conductive path from the openings to receive a charge signal for the charge electrode.

DESCRIPTION OF THE PREFERRED EMBODIMENTS

Figure 2:
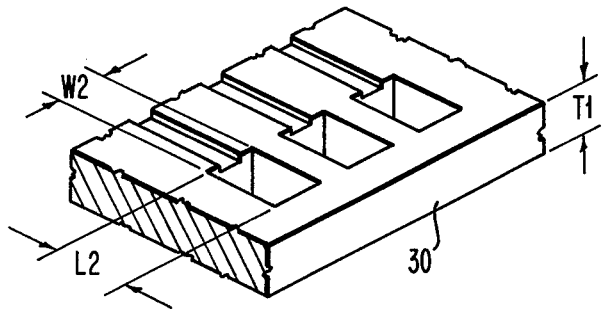
FIG. 2 is a perspective view showing a part of a finished layer of the charge electrode.
Figure 3:
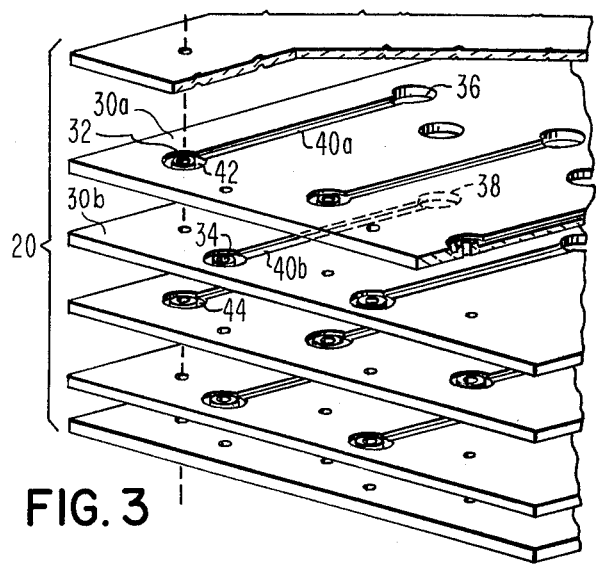
FIG. 3 is an exploded perspective view of a charge plate structure constructed in accordance with the invention.
Figure 4:
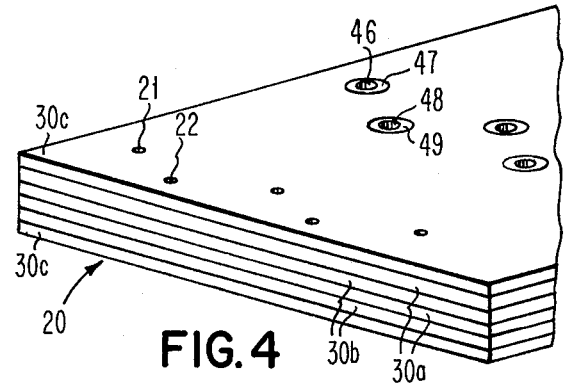
FIG. 4 is a perspective view of the assembled multi-layer laminated charge plate of FIG. 3.

Referring to FIGS. 3 and 4, a charge plate 20 is illustrated for use with an electrostatic pressure ink jet assembly. The charge plate is provided with a plurality of charge tunnel openings, which can be aligned in one row as shown in FIG. 2 or arranged in a plurality of rows as shown in FIG. 3. The charge tunnel openings extend entirely through the charge plate for passage of a corresponding plurality of fluid or ink jet streams. In accordance with the teaching of the Sweet et al patent, above, the plurality of ink jet streams are generated by a fluid jet head and caused to break into streams of uniformly sized drops. The charge plate 20 is positioned a distance away from the nozzle orifices such that the ink jet stream filaments break into the streams of uniform drops within the corresponding tunnel openings 21 and 22. The drops may thus be selectively given an electrostatic charge upon breakoff and the charge drops subsequently deflected by an electrostataic deflection field to a gutter while the uncharged drops continue toward a recording medium for impingement thereon.

A specific electrostatic pressure fluid jet head assembly including apparatus for generating the fluid streams, perturbating the fluid streams to control drop breakoff, and charging, deflection and guttering means are described in U.S. Pat. No. 3,955,203 of Chocholaty, assigned in common with the present application.

Structure of a charge plate 20 is illustrated in FIG. 3. The charge plate may be used in the ink jet head assembly of Chocholaty.

The charge electrode 20 is formed from a plurality of layers 30 of a suitable photosensitive material. The layers 30 each include a series of openings 32 and 34, and the layers may also include suitable conductors 40 which extend from a position adjacent first openings 32 and 34 to second openings 36 and 38. The layout of openings 32, 34 and 36, 38 and the conductors 40 serves to determine the configuration of the charge plate, and each of the charge plates 20 comprises a plurality of layers 30 laminated together in a chosen pattern.

Figure 1:
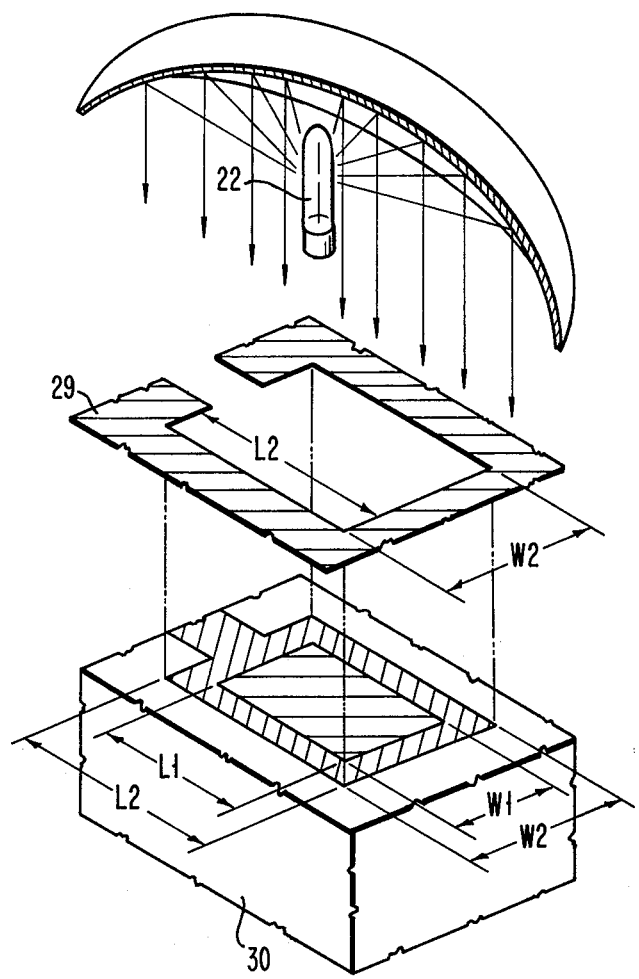
FIG. 1 is an exploded perspective view of the exposure step for one of the layers of the charge plate.

The individual layers are fabricated by exposing the photosensitive material through a mask to light of a wavelength to which the photosensitive material is sensitive and then heat treating the photosensitive material so that the characteristics of the material are changed. This operation is shown in FIG. 1 in which a single opening is shown. The layer 30 is exposed through mask 29 to radiation from a suitable source such as light source 22. The layer is then subjected to an etchant with the result that the material in the exposed areas is etched away. This operation produces the openings and the conductor paths in the layers as shown in FIG. 2 to produce a finished layer. All other layers necessary to produce the chosen charge plate geometry are produced in a similar fashion.

Etching techniques for photosensitive material are well known. Our co-pending patent application, Ser. No. 754,463, discloses a novel double exposure-double etch technique for photosensitive material which is especially adapted for producing precision parts such as the charge plate.

The metallization for the conductors is produced by filling the etched conductor paths with a metal paste and heating to cause the metal paste to coalesce to form a conductor. Alternatively the conductors may be formed from a suitable eutectic alloy which is heated and drawn into the conductor paths by capillary action.

The metallization step is preferably combined with the final step in the assembly of the charge plate. The final assembly step comprises aligning all individual layers in stacked configuration by a suitable fixture, for example, with all corresponding openings aligned. The charge plate assembly is then bonded by heat treating the assembled layers at a temperature and for a time sufficient to achieve self diffusion bonding. The heat treatment also serves to form the conductors and the through-hole connections at the same time since the metallization materials can usually be chosen to be compatible with the bonding temperature.

Our process is generally valid for any single material which is capable of being converted into multiple coexisting phases which have significantly different chemical behavior. However, the preferred material is a photosensitive glass. One suitable photosensitive glass is that sold under the trade name of "Foto-Ceram" by Corning Glass Company. This glass is processed by selectively exposing it through a suitable mask to a mercury/xenon light. This material is then heat treated by subjecting the layer to a temperature of about 592° C for about 30 minutes.

The heat treatment changes the characteristics of the glass in the exposed area so that this area is attacked at a much faster etching rate by a suitable etchant such as a 12% solution of hydrofluoric acid in water. The etching operation is utilized to produce the conductor slots and the through-holes for the charge tunnels and for the interconnection of the conductors. Our double expose-double etch technique has the advantage of providing both the precise finish dimensions for the through-holes as well as the conductor slots to the chosen depth.

Once the layers have been produced, the metallization can be produced in either of two ways. One way is to fill the conductor slots with a suitable paste comprising a paste of metal powder and frit in a suitable binder. The layer is then heated to coalesce the metal to form an electrical conductor in the slot. The layer may be lapped to insure that the metal pattern is formed in the slots if desired.

Alternatively, the metal paste may be placed in the conductor slots as before, but conduct the heat treatment to coalesce the metal powder as a part of the heat treatment to laminate the layers together.

Another way to produce the meallization is to use a eutectic alloy such as a gold-silicon eutectic which has a melting point of about 310° C. The metallization is produced by heating the charge plate to a temperature above the alloy melting point so that the metal is drawn into the conductor slots by capillary action. In some cases this operation can be accomplished along with the bonding operation.

These metallization techniques have the advantage that no passivation step is required to protect the charge plate from the corrosive action of the ink since the ink is separated from the conductors by substrate dielectric.

The heat treatment to bond the layers together is accomplished by first aligning each of the layers of the appropriate design in the appropriate order so that the through-holes are coaxially aligned by the use of a suitable fixture, for example. The aligned layers are then subjected to a heat of about 900° C for about 12–14 hours to produce lamination together of the layers by self-diffusion bonding. Light pressure may be applied during the heating operation by the fixture to keep the parts in contact if desired. Thus, while layers are referred to in this description in terms of the completed assembly, the individuality of the layers may be lost through the laminating process.

The embodiment of the charge electrode shown in FIG. 3 comprises a plurality of layers of photosensitive material each processed as described above to produce a personalized layer chosen to produce a particular charge plate 20. In the embodiment of the charge plates shown in FIG. 3, first layers 30a, and seond layers 30b provide a series of conductors 40. On layers 30a conductors 40a extend from adjacent opening 32 to opening 36, whereas on layers 30b conductors 40b extend from openings 34 to openings 38. A portion 42 of conductor 40a surrounds but is spaced from opening 32, and a portion 44 of conductor 40a surrounds opening 36. This operation provides a structure with the conductors out of contact with openings 32 and 34 which form the charge tunnels. A potential applied to terminals 46, 48 produces a field sufficient to charge the just-formed drop for subsequent deflection, but the electrodes are sealed from exposure to the ink. A through-hole connection 47, 48 is formed during the metallization step to produce an electrical connection for all corresponding conductors on the different layers so that an electrical signal connected to terminals 46, 48 will produce a corresponding electric field at the connected charge tunnel.

To produce the charge plate 20, the chosen number of layers 30a and 30b are positioned so that all openings 32, 34 and 36, 38 are aligned and a layer 30c is placed on top and bottom of the stacked layers. Layers 30c have no conductor pattern but have corresponding openings 32, 34 and 36, 38. The layers are then bonded together in a heat treating step as described above to form charge plate 20 as shown in FIG. 4. This charge plate provides a plurality of rows of openings with openings 32 providing one row of aligned openings and openings 34 providing another aligned row of openings. The openings 32, 34 are the same size and produced at the same position on each of the layers 30.

Layers 30a and 30b can be produced by any suitable technique. One suitable technique is the double-exposure, double-etch technique described in detail and claimed in our referenced co-pending application. This technique is advantageous since the openings can be etched to precisely the chosen size in the second etching operation, while at the same time producing the appropriate conductor line depth.

Figure 5:
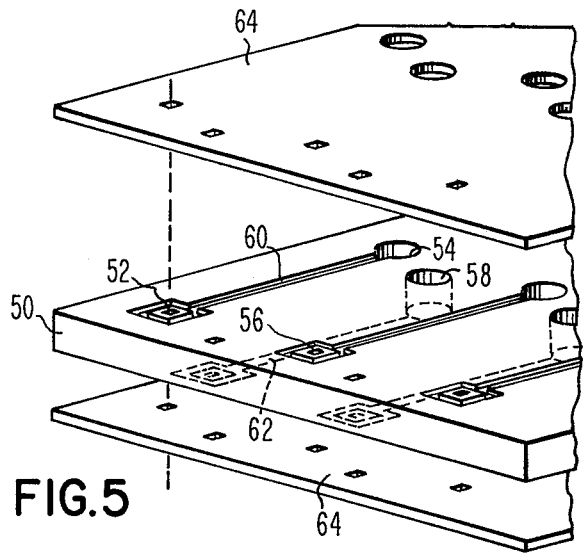
FIG. 5 is an exploded perspective view of a second charge electrode structure constructed in accordance with the invention.
Figure 6:
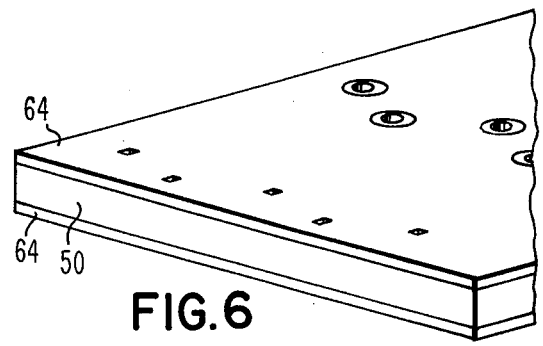
FIG. 6 is a perspective view of the assembled multi-layer laminated charge plate of FIG. 5.

The embodiment of the invention shown in FIG. 5 comprises a layer 50 having a pattern of openings 52, 54, and 56, 58 and conductor patterns 60 and 62. Conductor patterns 60 are provided on the top surface of layer 50 and conductor patterns 62 are provided on the bottom surface of layer 50. The conductor patterns are etched in a two-step process. The bottom surface is masked by a suitable material while the slots for conductor patterns 60 are etched and the top surface is etched while the slots for conductor patterns 62 are etched. The charge plate is assembled with layer 50 sandwiched between two layers 64 which have only openings 52, 53 and 56, 58 therein. The layers are laminated together in a self-diffusion bonding operation as described above.

Figure 7:
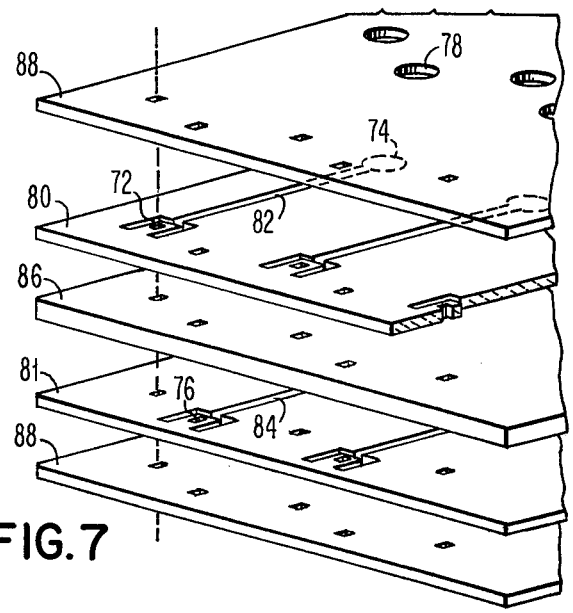
FIG. 7 is an exploded perspective view of another charge electrode structure constructed in accordance with the present invention.
Figure 8:
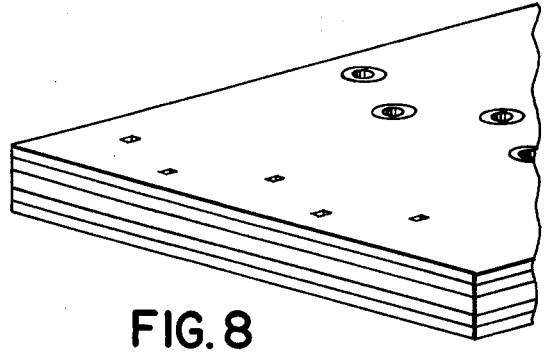
FIG. 8 is a perspective view of the assembled multi-layer laminated charge plate of FIG. 7.

The embodiment of the invention shown in FIG. 7 utilizes a plurality of layers in which the openings 72, 74 and 76, 78 are through-etched. Intermediate layer 80 has a through-etched pattern which includes openings 72, 74 and 76, 78 and openings 82 for the conductor patterns. Intermediate layer 81 has a through-etched pattern which includes openings 72, 74 and 76, 78 and openings 84 for the conductor patterns. Intermediate layer 86 has an etched pattern including openings 72, 74 and 76, 78. As shown in FIG. 8, the above-mentioned layers and a top and bottom layer 88 which includes openings 72, 74 and 76, 78 are stacked so that the openings 72, 74 and 76, 78 are all aligned. The layers are then bonded together and the metallization produced as previously described to produce a multi-layer laminated charge plate.

While the invention has been particularly shown and described with reference to a preferred embodiment thereof, it will be understood by those skilled in the art that various changes in the form and details may be made therein without departing from the spirit and scope of the invention.

What is claimed is:

1. The method for forming a multi-layer laminated charge plate for an ink jet printer comprising the steps of:

forming a plurality of layers from a photosensitive material by etching each of said layers to produce a predetermined pattern comprising a plurality of openings and conductor paths therein;

stacking said etched layers to that corresponding ones of said openings are in coaxial alignment;

heat treating said layers by heating to a termperature and for a period of time sufficient to bond said layers together; and metallizing said conductor paths to produce electrically conducting circuits along said conductor paths.

2. The method according to claim 1 wherein said photosensitive material comprises a photosensitive glass.

3. The method according to claim 2 wherein said heat treating step is carried out at a temperature of about 900° C for a time of about 12 to 14 hours.

4. The method according to claim 1 wherein said metallizing step comprises depositing into openings communicating with said conductor paths a eutectic alloy having a melting point lower than said heat treating temperature and heating said alloy above its melting point so that the metal flows into the conductor paths by capillary action.

5. The method according to claim 4 wherein said eutectic alloy comprises an alloy of gold and silicon having a melting point of about 310° C.

6. The method for forming a multi-layer laminated charge plate for an ink jet printer comprising the steps of:

forming a plurality of layers from a photosensitive material by etching each of said layers to produce a predetermined pattern comprising a plurality of openings and conductor paths therein;

depositing a metal paste in said conductor paths of each of said layers;

stacking said etched layers so that corresponding ones of said openings are in coaxial alignment; and heat treating said layers by heating to a temperature and for a period of time sufficient to bond said layers together and to coalesce the metal paste to produce electrical conductors in said conductor paths.

7. The method according to claim 6 wherein said photosensitive material comprises a photosensitive glass.

8. The method according to claim 7 wherein said heat treating is carried out at a temperature of about 900° C for a time of about 12 to 14 hours.

* * * * *